United States Patent
Yang et al.

(10) Patent No.: US 6,767,821 B1
(45) Date of Patent: Jul. 27, 2004

(54) METHOD FOR FABRICATING AN INTERCONNECT LINE

(76) Inventors: Chan-syun David Yang, 5711 Tubac La., San Jose, CA (US) 95118; Ajay Kumar, 510 Kenilworth Ct., Sunnyvale, CA (US) 94087; Wei-Te Wu, 7583 Normandy Way, Cupertino, CA (US) 95014; Changhun Lee, 10100 Torre Ave. #127, Cupertino, CA (US) 95014; Yeajer Arthur Chen, 744 Bodega Ct., Fremont, CA (US) 94539; Katsuhisa Kugimiya, 2-31-9 2-103, Kouzunomori, Narita-shi, Chiba (JP), 286-0048

(*) Notice: Subject to any disclaimer, the term of this patent is extended or adjusted under 35 U.S.C. 154(b) by 0 days.

(21) Appl. No.: 10/426,354

(22) Filed: Apr. 7, 2003

(51) Int. Cl.⁷ .......................................... H01L 21/4763

(52) U.S. Cl. ...................... 438/619; 438/669; 438/611; 438/666; 438/945

(58) Field of Search .......................... 438/52, 619, 669

(56) References Cited

U.S. PATENT DOCUMENTS

2002/0148807 A1 * 10/2002 Zhao et al. .................. 216/2

* cited by examiner

Primary Examiner—George Fourson
Assistant Examiner—Thanh V Pham
(74) Attorney, Agent, or Firm—Moser, Patterson & Sheridan, NJ; Joseph Bach

(57) ABSTRACT

A method of fabricating an interconnect line comprises forming a wall, depositing an etch mask having a thickness that decreases towards a bottom of the wall, and isotropically etching the wall at the bottom to form the interconnect line having a pre-determined gap between the substrate and a bottom of the line.

29 Claims, 7 Drawing Sheets

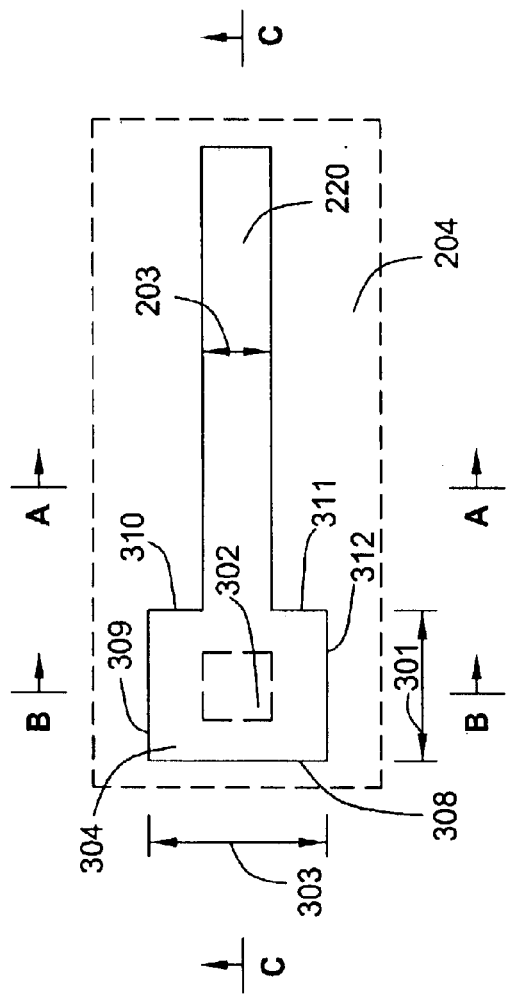
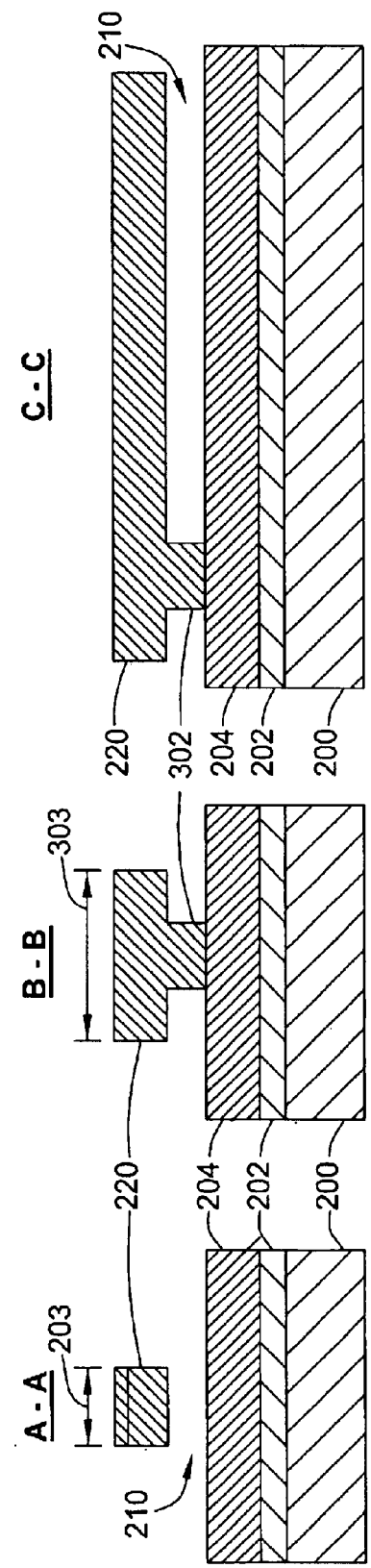
FIG. 3A
FIG. 3B
FIG. 3C
FIG. 3D

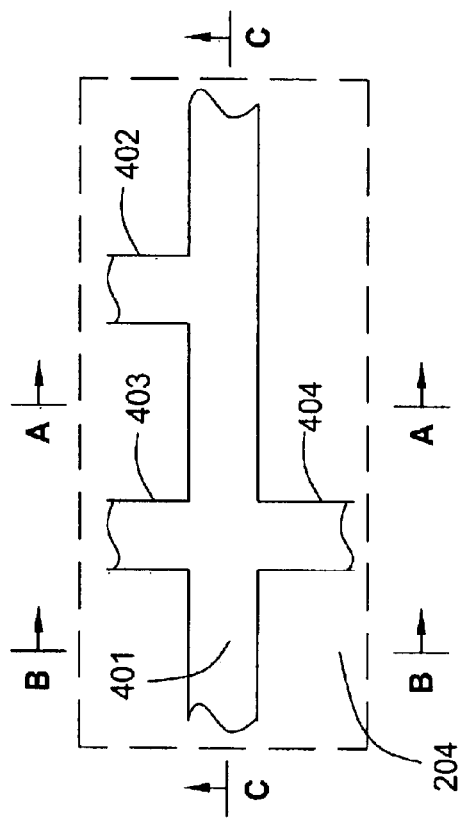
FIG. 4A
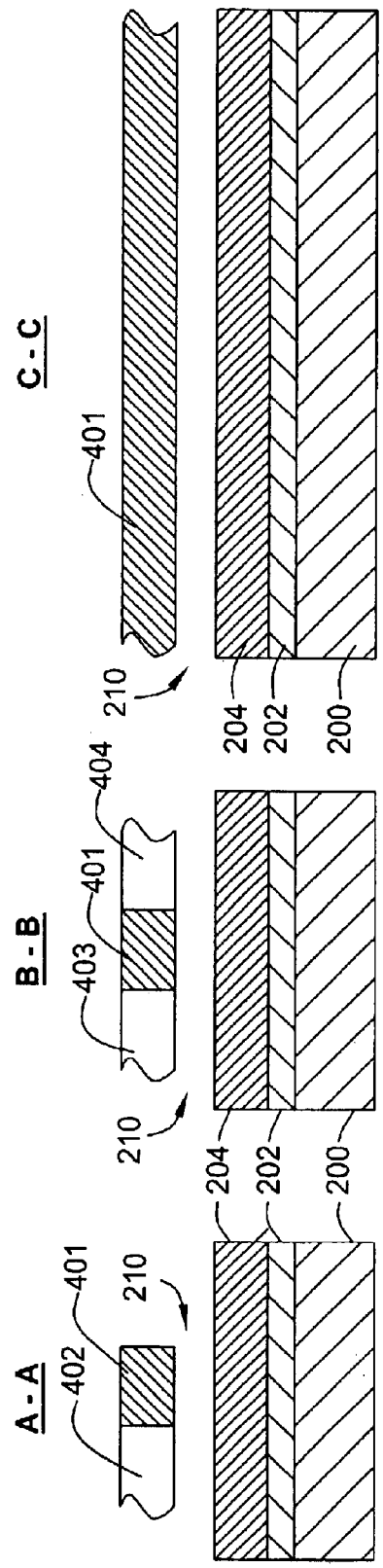
FIG. 4B
FIG. 4C
FIG. 4D

METHOD FOR FABRICATING AN INTERCONNECT LINE

BACKGROUND OF THE INVENTION

1. Field of Invention

The present invention generally relates to semiconductor substrate processing systems. More specifically, the present invention relates to a method for fabricating an interconnect line of an integrated electronic device.

2. Description of the Related Art

In advanced integrated circuits, a major cause of the circuit delay is a relatively high value of the time constant $\Delta T=RC$ of interconnect lines, where R and C are resistance and capacitance of the line per unit length, respectively. Increased capacitance between conductors of the lines degrades performance of integrated electronic devices (e.g., transistors, memory cells, and the like) and, specifically, decreases the propagation speed of electrical signals. Both low inter-line capacitances and low inter-level capacitances are important to alleviating this problem.

To decrease the capacitance, conventional high-speed integrated circuits use dielectric materials having a low dielectric constant (i.e., low-K dielectric materials having a dielectric constant that is less than 2.5–3.0). Such low-K dielectric materials generally comprise carbon doped silicon oxide, organic doped silicon glass (OSG), fluorine doped silicon glass (FSG), and the like.

To develop yet faster electronic devices, capacitance of the interconnect lines should be reduced even further. Using air as a dielectric material is the most effective way to reduce capacitance of an interconnect line and, as such, the RC delay, since the air has a dielectric constant of 1 that is less than the dielectric constant of any other material.

Controlled air gaps (also known in the art as "air bridges") may be formed beneath a conductor of the interconnect line. Using a conventional technique, the conductor is formed on a sacrificial dielectric layer that then is selectively removed during a dry or wet etch process. However, such a technique poses many integration, reliability, and manufacturability problems that limit the use of air bridges in the integrated circuits.

Therefore, there is a need in the art for an improved method of fabricating an interconnect line having an air bridge.

SUMMARY OF THE INVENTION

A method of fabricating an interconnect line comprises forming a wall of conductive material, depositing an etch mask having a thickness that decreases towards a bottom of the wall, and isotropically etching the wall at the bottom to form the interconnect line having a pre-determined gap between the substrate and a bottom of the line.

In one exemplary embodiment, the wall comprises polysilicon, the etch mask is formed using at least one fluorocarbon gas or hydrofluorocarbon gas (e.g., $C_4F_8$, $CHF_3$, and the like), and the etch process uses sulfur hexafluoride ($SF_6$) and the like.

BRIEF DESCRIPTION OF THE DRAWINGS

The teachings of the present invention can be readily understood by considering the following detailed description in conjunction with the accompanying drawings, in which:

FIGS. 3A and 3B–3D, together, depict schematic, top plan view and cross-sectional views of a substrate having simultaneously fabricated an interconnect line of FIGS. 2A–2F and an exemplary electrical terminal for the line;

FIGS. 4A and 4B–4D, together, depict schematic, top plan view and cross-sectional views of a substrate having simultaneously fabricated an exemplary network of electrically coupled interconnect lines of FIGS. 2A–2F.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of fabricating, on a semiconductor substrate, an interconnect line having in at least one region of the line an air gap (i.e., air bridge) that is used as a line dielectric. Such line provides high-speed propagation of electrical signals. The terms "gap", "air gap", and "air bridge" are used herein interchangeably.

Figure 1:
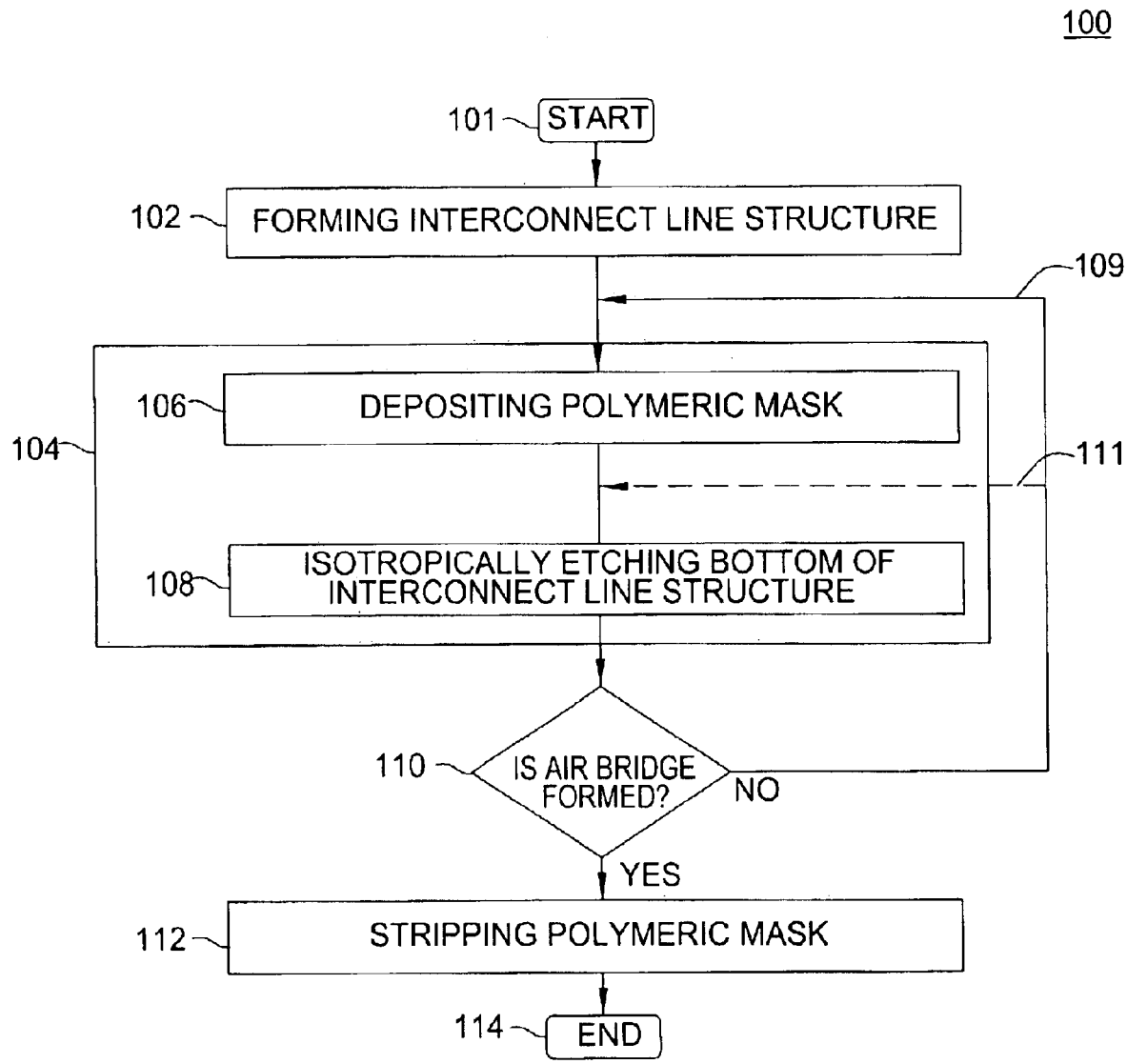
FIG. 1 depicts a flow diagram of a method of a high-speed interconnect line in accordance with the present invention.

FIG. 1 depicts a flow diagram of a method 100 of fabricating an interconnect line in accordance with the present invention. The method 100 comprises processes that are performed upon an interconnect line structure during fabrication of the interconnect line having the line dielectric removed beneath the line conductor.

FIGS. 2A–2F, together, depict a sequence of schematic, cross-sectional views of a substrate having an interconnect line being formed in accordance with the method 100 of FIG. 1. The views in FIGS. 2A–2F relate to individual processing steps that are used to fabricate the interconnect line. FIGS. 3A–3D and 4A–4D illustrate simultaneous fabricating the interconnect line of FIGS. 2A–2F and a line terminal and an exemplary network of electrically coupled interconnect lines using the method 100, respectively. The images in FIGS. 2A–2F, 3A–3D, and 4A–4D are not depicted to scale and are simplified for illustrative purposes.

Figure 2A:
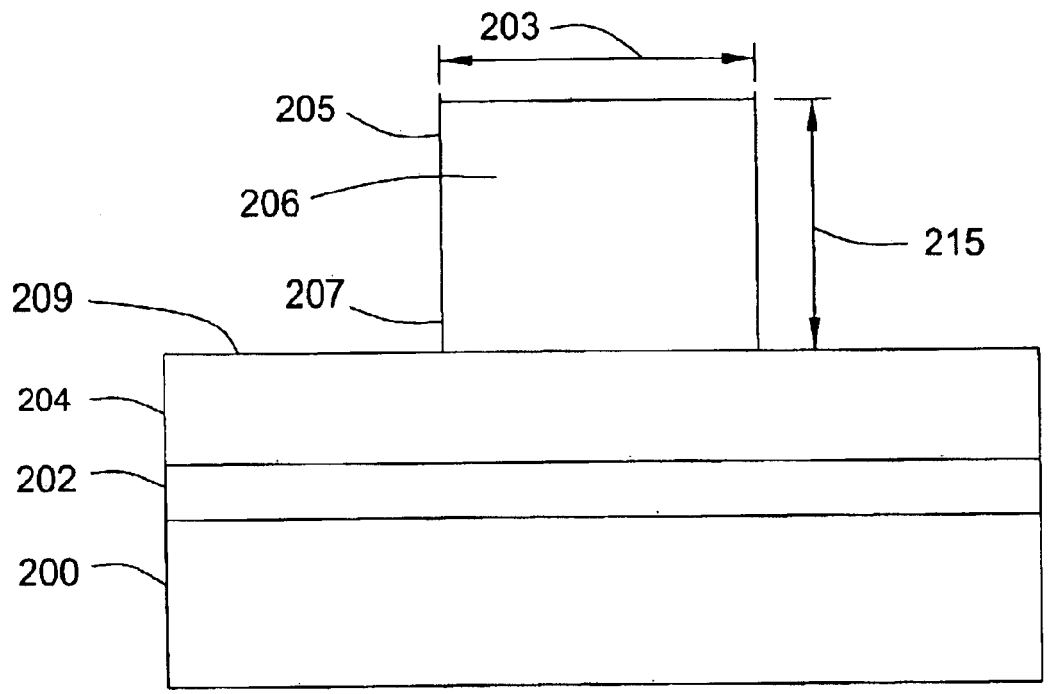
FIGS. 2A–2F, together, depict a sequence of schematic, top plan and cross-sectional views of a substrate having an interconnect line being fabricated in accordance with the method of FIG. 1.
Figure 2B:
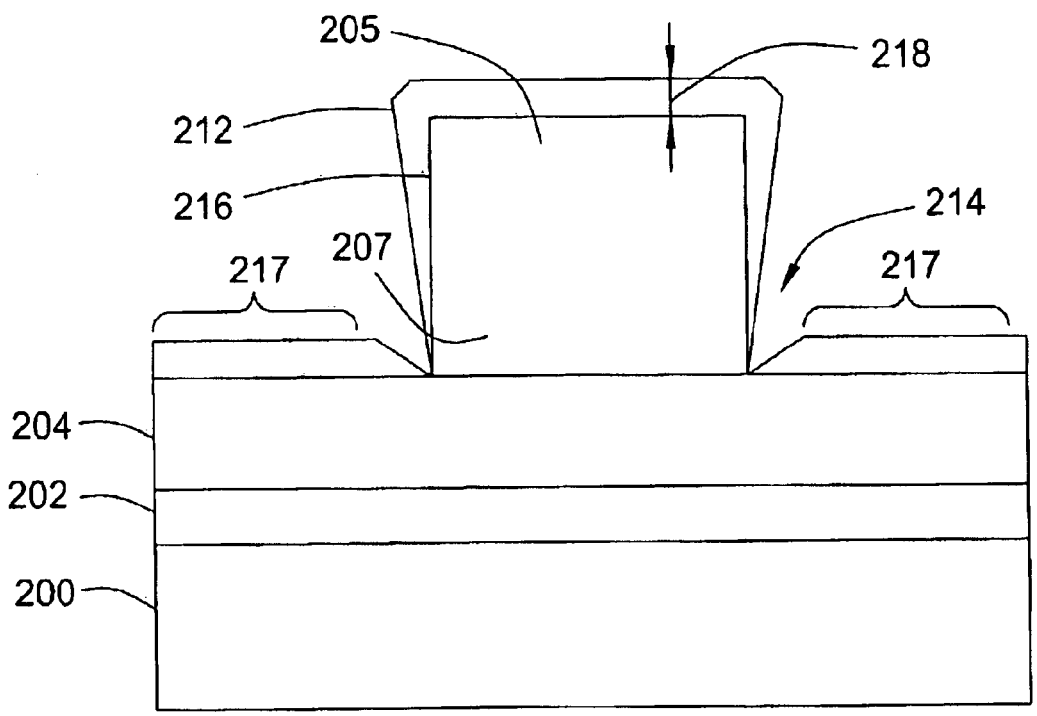

The method 100 starts at step 101 and proceeds to step 102, when an interconnect line structure 202 is formed on a wafer 200, e.g., silicon (Si) wafer (FIG. 2A).

In one exemplary embodiment, the interconnect line structure 202 comprises a barrier layer 202, a conductive layer 204, and a raised structure (e.g., vertical wall) 206. The vertical wall 206 has the same topography (i.e., layout) as the interconnect line being fabricated. A top portion 205 of the wall 206 has a width 203 that is substantially equal to the width of a conductor 220 of such line. Further, a height 215 of the wall 206 is selected to be substantially equal to a sum of a thickness 211 of the conductor 220 and a height 213 of a pre-determined gap 210 between the substrate 200 and the conductor (discussed in reference to FIG. 2E below).

The barrier layer 202 generally is formed from at least one film of a dielectric material, such as silicon dioxide ($SiO_2$), silicon carbide (SiC), silicon nitride (Si$_3$N$_4$), and the like. The conductive layer 204 and wall 206 are formed from a conductive material, such as metal (e.g., aluminum (Al), tantalum (Ta), and the like), metal nitride (e.g., tantalum nitride (TaN) and the like), doped polysilicon (Si), silicon (Si), and the like.

In the depicted exemplary embodiment, the conductive layer 204 and wall 206 are both formed from doped polysilicon. The polysilicon wall 206 may be formed from a portion of the polysilicon layer 204 using a plasma etch process. Such polysilicon etch processes are well known in the art using fluorine-based chemistries and the like.

The polysilicon etch process using a fluorine-based chemistry may be performed, e.g., in a Decoupled Plasma Source (DPS) chamber of the CENTURA® semiconductor wafer processing system available from Applied Materials, Inc. of Santa Clara, Calif. The DPS reactor uses an inductive source to produce a high-density plasma and a source of RF power to bias the wafer. The DPS reactor is described in detail in reference to FIG. 5 below.

Figure 2C:
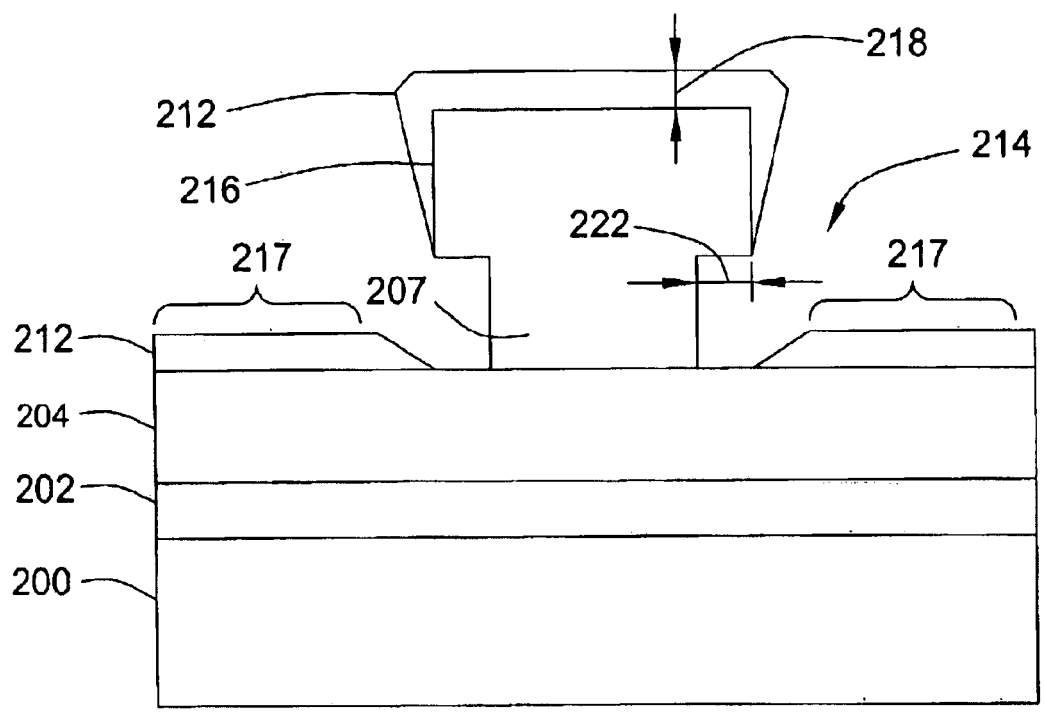
Figure 2D:
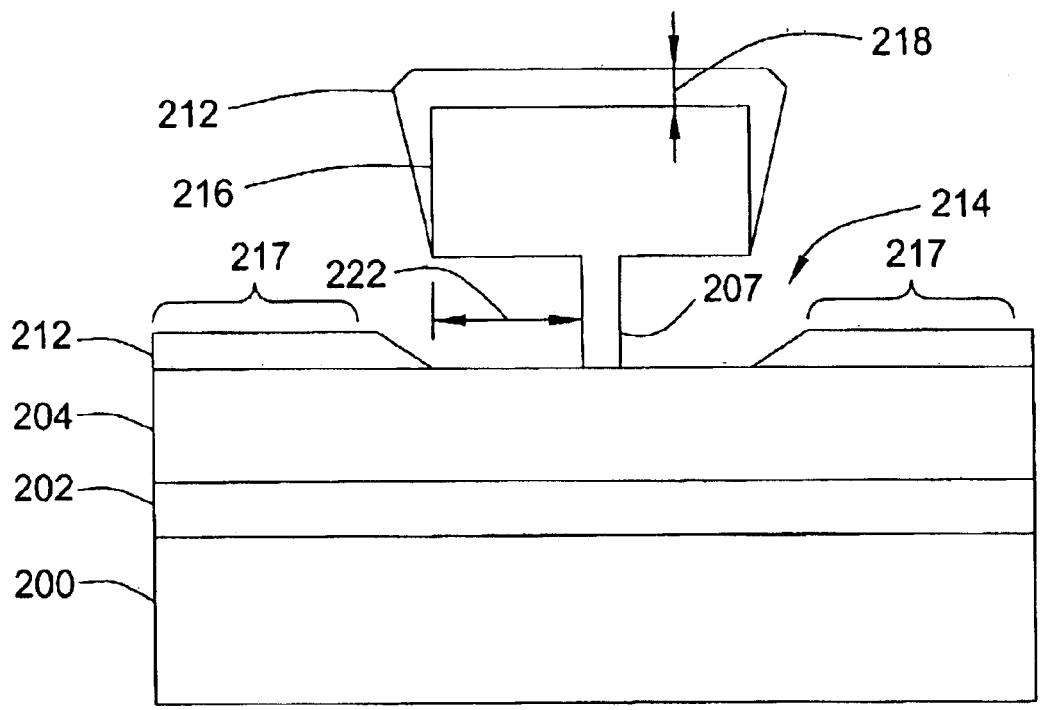
Figure 2E:
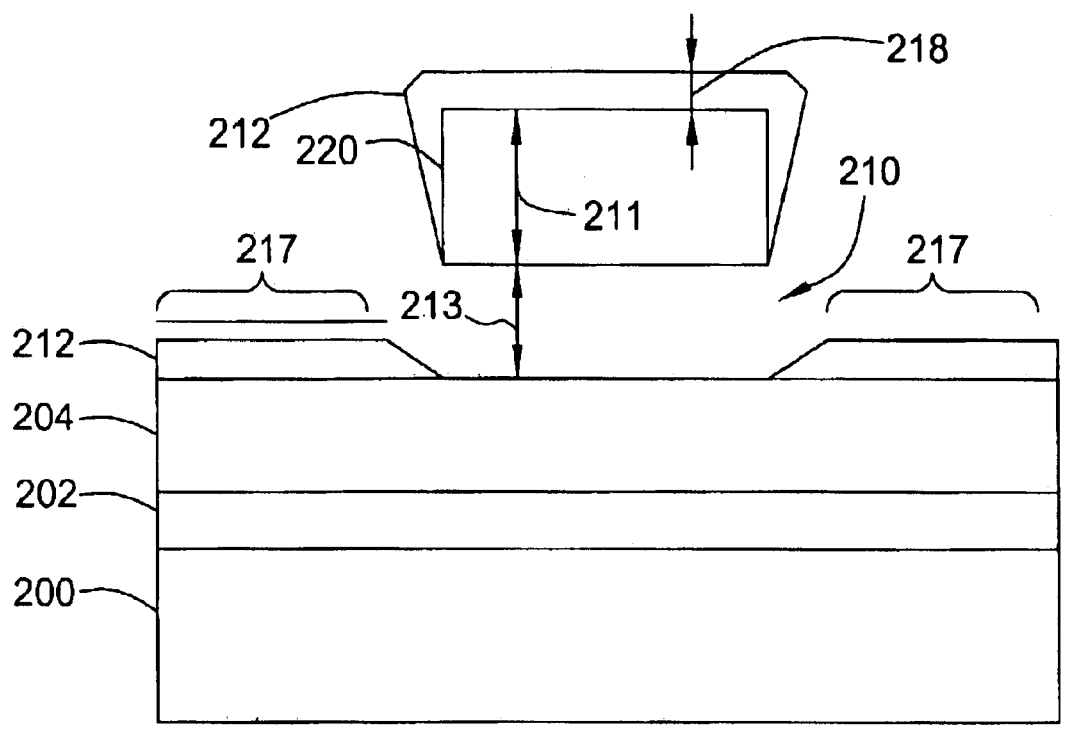
Figure 2F:
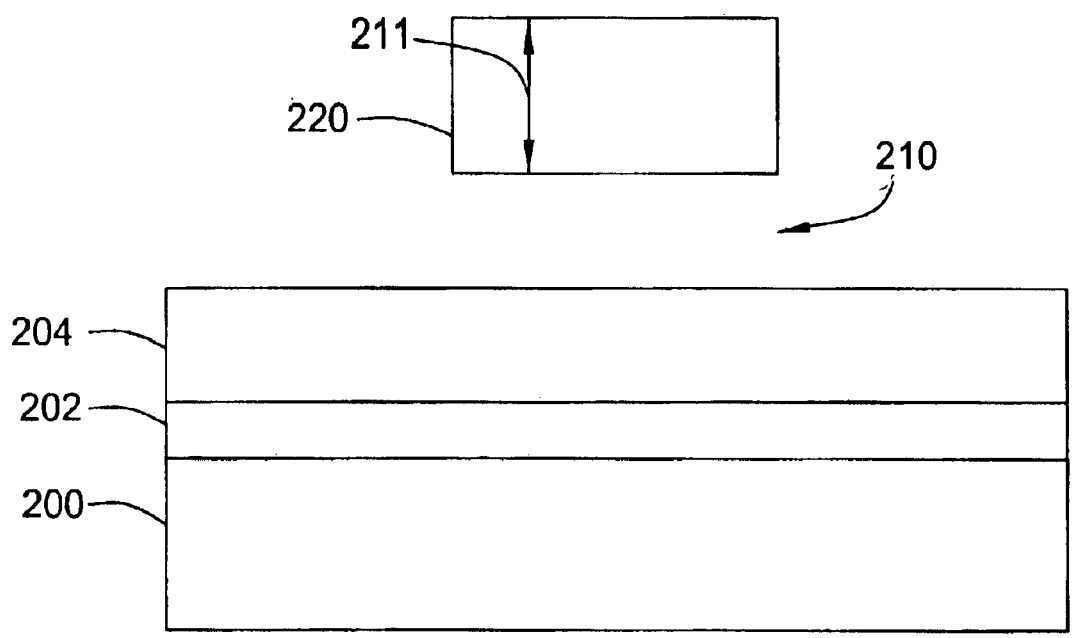

At step 104, the wall 206 is laterally plasma etched at a bottom portion 207 to form a conductor 220 that is separated from the conductive layer 204 by a pre-determined gap 210 (FIGS. 2B–2E). Step 104 comprises a period 106 of depositing a protective mask 212 upon the wall 206 and conductive layer 204 (FIG. 2B) and a period 108 of isotropic plasma etching the wall 206 at the bottom portion 207 (FIGS. 2C–2E).

During the period 106, step 104 performs a plasma deposition process that uses a passivating gas comprising at least one fluorocarbon gas or hydrofluorocarbon gas (e.g., C$_4$F$_8$, trifluoromethane (CHF$_3$), and the like) to form a polymeric coating (mask 212) on the interconnect line structure 202. The process provides deliberately poor step coverage, i.e., a thickness of the protective mask 212 on horizontal surfaces is greater than on the vertical surfaces. Specifically, a thickness 218 of the protective mask 212 on the top portion 205 of the wall 206 and on exposed portions 217 of a surface 209 of the conductive layer 204 is greater than the thickness of the mask on the bottom portion 207 of the wall and in a corner region 214 where the wall 206 meets the layer 204. Further, the thickness 218 rapidly decreases along a sidewall 216 of the wall 206 and is minimal or none in the bottom portion 207 and corner region 214.

The period 106 has a duration that continues until the protective mask 212 is formed to the thickness 218 that is sufficient to protect the top portion 205 of the wall 206, as well as the surface 209 during the following isotropic etch process (discussed in reference to FIGS. 2C–2E).

The plasma deposition process of the period 106 may be performed using, e.g., the DPS reactor. In one exemplary embodiment, the period 106 supplies about 20 to 500 sccm of C$_4$F$_8$, applies plasma power of about 200 to 3000 Watts and bias power of about 0 to 100 Watts, and maintains a gas pressure in the process chamber at about 10 to 100 mTorr and a wafer temperature at about 10 to 100 degrees Celsius. One illustrative process provides 300 sccm of C$_4$F$_8$, applies 1800 Watts of plasma power and no bias power, a pressure of 40 mTorr and a temperature of 30 degrees Celsius. Duration of depositing the protective mask 212 is generally between 5 and 20 seconds.

During the period 108, step 104 performs an isotropic plasma etch (IPE) process that laterally etches and removes a portion of the wall 206 that is not protected by the mask 212 (i.e., the bottom portion 207). The IPE process forms the conductor 220 of the interconnect line being fabricated (discussed in reference to FIG. 2E below), as well as the pre-determined gap (i.e., air bridge) 210 between the conductor 220 and conducting layer 204. FIGS. 2C and 2D depict intermediate stages of the IPE process and FIG. 2E depicts the final stage of the process.

In one embodiment, to etch the polysilicon wall 206, the IPE process uses a gas such as sulfur hexafluoride (SF$_6$) and the like. When the preceding period 106 forms a thin film or traces of polymeric coating at the bottom portion 207 or corner region 214 of the wall 206, the IPE process promptly removes such thin film or traces of the coating. Then, the IPE process laterally etches (or notches) the unprotected portion of the sidewall 216 (i.e., bottom portion 207), as shown in FIG. 2C. A width 222 of the notch gradually increases as the IPE process progresses (FIG. 2D). The IPE process continues until the gap 210 that separates the conducting layer 204 from a remaining upper portion of the wall 206 is formed to a pre-determined height 213 (FIG. 2E). The remaining upper portion of the wall 206 forms the conductor 220 of the interconnect line being fabricated.

The IPE process of the period 108 may be performed using, e.g., the DPS reactor. In one exemplary embodiment, the period 108 supplies about 20 to 500 sccm of sulfur hexafluoride, applies plasma power of about 200 to 3000 Watts and bias power of about 0 to 300 Watts, and maintains a gas pressure in the process chamber at about 5 to 500 mTorr and a wafer temperature at about 10 to 100 degrees Celsius. One illustrative process provides 250 sccm of SF$_6$, applies 1000 Watts of plasma power and 20 W of bias power, a pressure of 40 mtorr and a temperature of 10 degrees Celsius. The process provides relative selectivity to polysilicon (wall 206) over the polymeric coating (protective mask 112) of about 20:1 or greater and, as such, facilitates directional notching of the wall in the unprotected bottom portion 207.

Similarly, in an alternative embodiment, when the wall 206 is formed from a metal, metal nitride or other conductive material, the IPE process uses the etchant gas that is suitable for lateral etching that material, as described above in reference to the polysilicon wall 206. For example, when the wall 206 comprises aluminum (Al) and/or titanium nitride (TiN), the IPE process may use a gas comprising carbon tetrafluoride (CF$_4$), sulfur hexafluoride (SF$_6$), and the like. Such process may be performed, e.g., in the DPS reactor.

At step 110, the method 100 queries whether the IPE process is completed, i.e., the air bridge 210 and conductor 220 has been formed. In a computerized reactor, such as the DPS reactor, at step 110, the decision making routine may be automated using an end-point detection technique, control of process time, laser interferometry, and the like. If the query of step 110 is negatively answered, the method 100 proceeds to step 104 to continue lateral etching of the wall 206, as shown using a link 109.

The protective mask 212 is being gradually consumed during the IPE process. Generally, the mask should be re-applied to compensate for losses sustained during the period 108. Such losses are greater in applications using the walls 206 having greater widths. After the mask 212 has been reapplied, the period 106 is terminated and the period 108 commences. The method 100 may comprise one or more cycles each comprising the period 106 and period 108. However, in some applications, the protective mask 212 has an initial thickness (i.e., thickness 218) that is sufficient for the IPE process to continue until the gap 210 and conductor 220 has been formed. In such applications, if the query of step 110 is negatively answered, the method 100 may proceed to the period 108 to continue the IPE process, as shown using a link 111. Therefore, the period 106 is considered optional in the repetitive cycles.

If the query of step 110 is affirmatively answered, the method 100 proceeds to step 112. At step 112, the polymeric protective mask 212 is removed using, e.g., a conventional polymer removal solution, such as a mixture of sulfuric acid ($H_2SO_4$) and hydrogen peroxide ($H_2O_2$). At step 114, the method 100 ends.

To form an electrical connection (i.e., a node) between the conductor 220 and conductive layer 204, the wall 206 may be provided with a connector section 304 (FIG. 3A). The section 304 has larger widths 301 and 303 than the width 203 of the conductor 220. During the period 108, the IPE process can simultaneously form the conductor 220 and notch the sidewalls 308–312 of the section 304 to form a post 302 in a central region of the connector section 304 (FIGS. 3B–3D). Since the connector section 304 is wider than the conductor 220, the IPE process removes all the material beneath the conductor 220, but leaves a post 302 under the connector section 304. The post 302 facilitates the conductive connection between the conductor 220 and conductive layer 204.

In the depicted embodiment, a single conductor (conductor 220) is terminated at the connector section 304. In other embodiments (not shown), more than one wall may be terminated at the section 304. As such, a plurality of interconnect lines having a common conductive connection (i.e., post 302) to the conductive layer 204 may be fabricated using the method 100.

To facilitate an electrical connection between conductors belonging to separate interconnect lines, a plurality of the walls of the respective interconnect line structures may branch from or be terminated at one another, as illustratively shown FIG. 4A using exemplary interconnect lines 401–404. Such walls form an integrated raised structure. Using the method 100, a plurality of conductive coupled interconnect lines (i.e., network) may be fabricated simultaneously (FIGS. 4B–4D). Any of the interconnect lines may be further comprise one or more posts (e.g., post 302) that provides a conductive connection to the conductive layer 204, as discussed above in reference to FIGS. 3A–3D. In the depicted illustrative embodiment, all lines 401–404 have air bridges. In alternative embodiments, some of such lines may comprise a dielectric other than air.

The wafer 200 may comprise at least one other wiring layer (not shown), which may be considered, with respect to the conducting layer 204 and barrier layer 202, as an underlying wiring layer. Those skilled in the art will appreciate that the conducting layer 204 may be further patterned to form pluralities of described above interconnect lines, contact posts, and the like. As such, the method 100 may be used to fabricate a multi-layer network of interconnect lines where all or some lines comprise air bridges.

Figure 5:
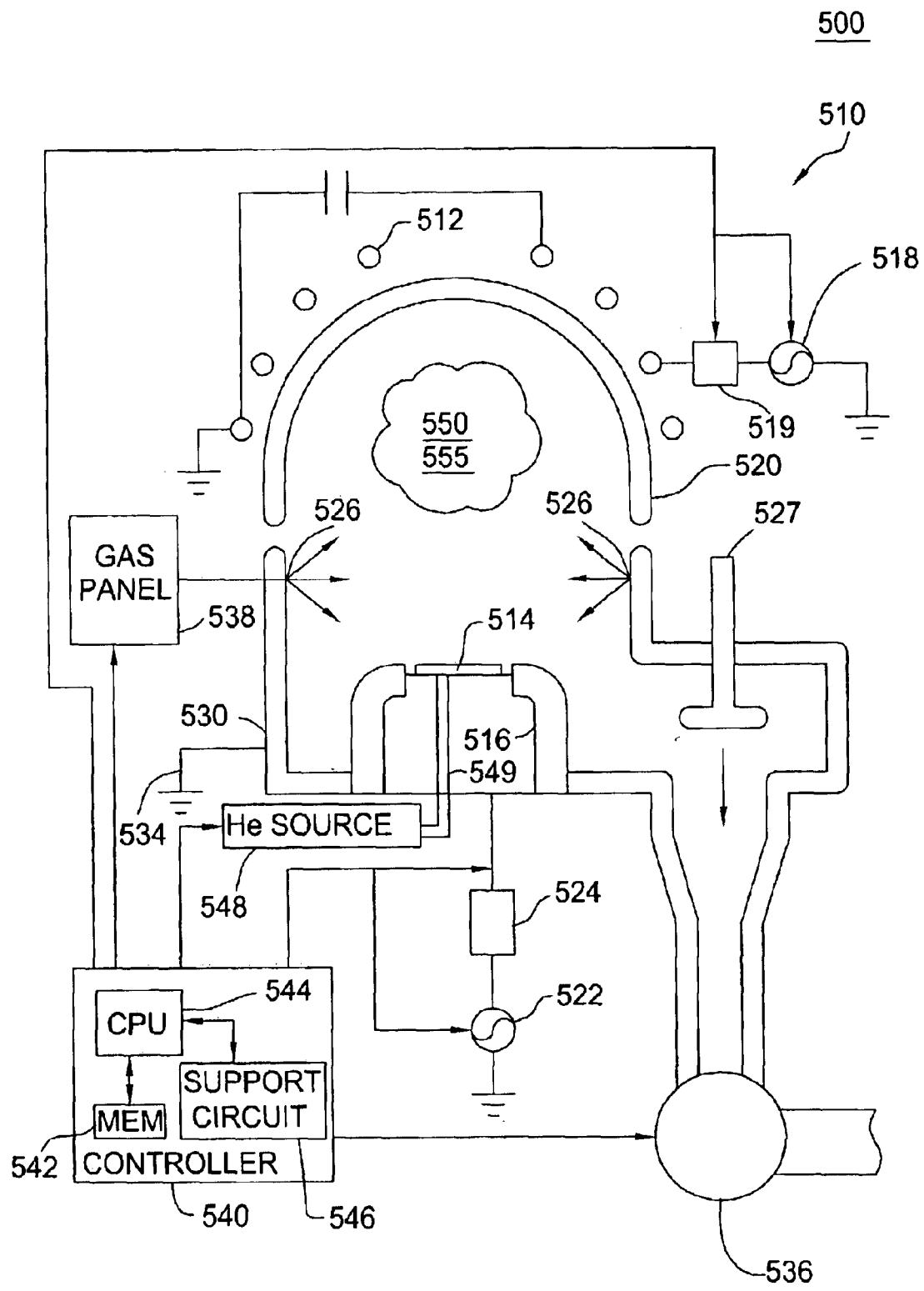
FIG. 5 depicts a schematic diagram of an exemplary plasma processing apparatus of the kind used in performing portions of the inventive method.

FIG. 5 depicts a schematic diagram of an exemplary Decoupled Plasma Source (DPS) etch reactor 500 that may be used to practice portions of the invention. The DPS reactor is available from Applied Materials, Inc. of Santa Clara, Calif.

The reactor 500 comprises a process chamber 510 having a wafer support pedestal 516 within a conductive body (wall) 530, and a controller 540.

The support pedestal (cathode) 516 is coupled, through a first matching network 524, to a biasing power source 522. The biasing source 522 generally is a source of up to 500 W at a frequency of approximately 13.56 MHz that is capable of producing either continuous or pulsed power. In other embodiments, the source 522 may be a DC or pulsed DC source. The chamber 510 is supplied with a dome-shaped dielectric ceiling 520. Other modifications of the chamber 510 may have other types of ceilings, e.g., a substantially flat ceiling. Above the ceiling 520 is disposed an inductive coil antenna 512. The antenna 512 is coupled, through a second matching network 519, to a plasma power source 518. The plasma source 518 typically is capable of producing up to 3000 W at a tunable frequency in a range from 50 kHz to 13.56 MHz. Typically, the wall 530 is coupled to an electrical ground 534.

A controller 540 comprises a central processing unit (CPU) 544, a memory 542, and support circuits 546 for the CPU 544 and facilitates control of the components of the DPS etch process chamber 510 and, as such, of the etch process, as discussed below in further detail.

In operation, a semiconductor wafer 514 is placed on the pedestal 516 and process gases are supplied from a gas panel 538 through entry ports 526 and form a gaseous mixture 550. The gaseous mixture 550 is ignited into a plasma 555 in the chamber 510 by applying power from the plasma and bias sources 518 and 522 to the antenna 512 and the cathode 516, respectively. The pressure within the interior of the chamber 510 is controlled using a throttle valve 527 and a vacuum pump 536. The temperature of the chamber wall 530 is controlled using liquid-containing conduits (not shown) that run through the wall 530.

The temperature of the wafer 514 is controlled by stabilizing a temperature of the support pedestal 516. In one embodiment, the helium gas from a gas source 548 is provided via a gas conduit 549 to channels formed by the back of the wafer 514 and grooves (not shown) in the pedestal surface. The helium gas is used to facilitate heat transfer between the pedestal 516 and the wafer 514. During the processing, the pedestal 516 may be heated by a resistive heater (not shown) within the pedestal to a steady state temperature and then the helium gas facilitates uniform heating of the wafer 514. Using such thermal control, the wafer 514 is maintained at a temperature of between 0 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the process chamber 510 as described above, the controller 540 may be one of any form of general-purpose computer processor that can be used in an industrial setting for controlling various chambers and sub-processors. The memory, or computer-readable medium, 542 of the CPU 544 may be one or more of readily available memory such as random access memory (RAM), read only memory (ROM), floppy disk, hard disk, or any other form of digital storage, local or remote. The support circuits 546 are coupled to the CPU 544 for supporting the processor in a conventional manner. These circuits include cache, power supplies, clock circuits, input/output circuitry and subsystems, and the like. The inventive method is generally stored in the memory 542 as software routine. The software routine may also be stored and/or executed by a second CPU (not shown) that is remotely located from the hardware being controlled by the CPU 544.

The invention may be practiced using other semiconductor wafer processing systems wherein the processing parameters may be adjusted to achieve acceptable characteristics by those skilled in the arts by utilizing the teachings disclosed herein without departing from the spirit of the invention.

Although the forgoing discussion referred to fabrication of a high-speed interconnect line, fabrication of the other devices and structures used in the integrated circuits can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of fabricating an interconnect line on a semiconductor substrate, comprising:
   (a) providing e substrate having a wall formed of a material, where the wall has a top and sidewalls;
   (b) depositing on the wall an etch mask, where the etch mask covers the top and sidewalls of the wall and has a thickness that decreases towards a bottom of the sidewalls of the wall; and
   (c) isotropically etching the wall at the bottom using the mask to form the interconnect line having a gap between the substrate and a bottom of the interconnect line.

2. The method of claim 1 comprising at least one cycle comprising the step (b) and step (c).

3. The method of claim 1 wherein the material comprises a conductive material.

4. The method of claim 1 wherein the material comprises at least one of a metal, metal nitride, silicon, and polysilicon.

5. The method of claim 1 wherein a height of the wall is substantially equal to a sum of the gap and a thickness of the interconnect line.

6. The method of claim 1 wherein the wall comprises at least one region where a width of the wall and a width of the interconnect line are substantially the same.

7. The method of claim 1 wherein the wall comprises at least one region where a width of the wall is greater than the width of the interconnect line.

8. The method of claim 7 wherein the at least one region comprises a post coupling the interconnect line to the substrate.

9. The method of claim 1 wherein the wall forms a conductive coupling with at least one other wall.

10. The method of claim 1 wherein the step (b) uses a plasma comprising at least one of a fluorocarbon gas or a hydrofluorocarbon gas.

11. The method of claim 10 wherein the step (b) uses a plasma comprising at least one of $C_4F_8$ and $CHF_3$.

12. The method of claim 11 further comprising:
   supplying about 20 to 500 sccm of $C_4F_8$ and maintaining a gas pressure in a process chamber at about 1 to 100 mTorr; and
   applying plasma power of about 200 to 3000 W and substrate bias power of about 0 to 100 W; and
   maintaining the substrate at a temperature of about 10 to 100 degrees Celsius.

13. The method of claim 1 wherein the step (c) uses a plasma comprising $SF_6$.

14. The method of claim 13 further comprising:
   supplying about 20 to 500 sccm of $SF_6$ and maintaining a gas pressure in a process chamber at about 5 to 500 mTorr;
   applying plasma power of about 200 to 3000 W and substrate bias power of about 0 to 300 W; and
   maintaining the substrate at a temperature of about 10 to 100 degrees Celsius.

15. A method of fabricating an interconnect line on a substrate, comprising:
   (a) providing a substrate having a wall formed of polysilicon, where the wall has a top and sidewalls;
   (b) depositing on the wall an etch mask without substantially etching the wall by supplying about 20 to 500 sccm of $C_4F_8$, maintaining a gas pressure in a process chamber at about 10 to 100 mTorr, applying plasma power of about 200 to 3000 W and substrate bias power of about 0 to 100 W, and maintaining the substrate at a temperature of about 10 to 100 degrees Celsius; and
   (c) isotropically etching the wall at the bottom using the mask to form the interconnect line having a gap between the substrate and a bottom of the interconnect line by supplying about 20 to 500 sccm of $SF_6$, maintaining a gas pressure in a process chamber at about 5 to 500 mTorr, applying plasma power of about 200 to 3000 W and substrate bias power of about 0 to 300 W, and maintaining the substrate at a temperature of about 10 to 100 degrees Celsius.

16. The method of claim 15 comprising at least one cycle comprising the step (b) and step (c).

17. The method of claim 15 wherein a height of the wall is substantially equal to a sum of the gap and a thickness of the interconnect line.

18. The method of claim 15 wherein the wall comprises at least one region where a width of the wall and a width of the interconnect line are substantially the same.

19. A method of fabricating an interconnect line on a semiconductor substrate, comprising:
   (a) providing the substrate having a structure formed thereon, the structure having a sidewall;
   (b) depositing an etch mask on the sidewall without substantially etching the sidewall; and
   (c) isotropically etching an exposed portion of the sidewall using the mask to form a gap.

20. The method of claim 19, further comprising:
   isotropically etching the etch mask to expose a portion of the sidewall.

21. The method of claim 19, wherein the structure comprises a conductive material.

22. The method of claim 19, wherein the conductive material comprises at least one of a metal, metal nitride, silicon, and polysilicon.

23. The method of claim 19, wherein the etch mask has a thickness that tapers towards the substrate.

24. The method of claim 19, wherein the undercut forms a gap between the structure and the substrate.

25. The method of claim 19, wherein the structure comprises at least one region where a width of the structure is greater than the width of the interconnect line.

26. The method of claim 25, wherein the at least one region comprises a post coupling the interconnect line to the substrate.

27. The method of claim 19, wherein the step (b) uses a plasma comprising at least one of a fluorocarbon gas or a hydrofluorocarbon gas.

28. The method of claim 27, wherein the step (b) uses a plasma comprising at least one of $C_4F_8$ and $CHF_3$.

29. The method of claim 19, wherein the step (c) uses a plasma comprising $SF_8$.

* * * * *

UNITED STATES PATENT AND TRADEMARK OFFICE
CERTIFICATE OF CORRECTION

PATENT NO. : 6,767,821 B1
DATED : July 27, 2004
INVENTOR(S) : Chan-syun David Yang et al.

It is certified that error appears in the above-identified patent and that said Letters Patent is hereby corrected as shown below:

Column 7,
Line 17, please change "providing e substrate" to -- providing a substrate --.
Line 54, please change "about 1 to 100" to -- about 10 to 100 --.

Column 8,
Line 46, please change "claim 19" to -- claim 21 --.

Signed and Sealed this

Twenty-first Day of December, 2004

JON W. DUDAS
*Director of the United States Patent and Trademark Office*